United States Patent [19]

Toda et al.

[11] Patent Number: 4,754,170

[45] Date of Patent: Jun. 28, 1988

[54] BUFFER CIRCUIT FOR MINIMIZING NOISE IN AN INTEGRATED CIRCUIT

[75] Inventors: Haruki Toda; Naokazu Miyawaki; Hiroyuki Koinuma, all of Yokohama, Japan

[73] Assignee: Kabushiki Kaisha Toshiba, Kanagawa, Japan

[21] Appl. No.: 464

[22] Filed: Jan. 5, 1987

[30] Foreign Application Priority Data

Jan. 8, 1986 [JP] Japan .................... 61-1609

[51] Int. Cl.⁴ .................. H03K 17/16; H03K 17/693
[52] U.S. Cl. .................... 307/443; 307/448; 307/451; 307/555; 307/568; 307/577; 307/264; 307/270
[58] Field of Search ............. 307/200 B, 443, 448, 307/481, 451–453, 542, 552, 555, 557, 567–568, 572, 579, 577, 581, 584–585, 264, 270

[56] References Cited

U.S. PATENT DOCUMENTS

| | | | |
|---|---|---|---|
| 3,914,702 | 10/1975 | Gehweiler | 307/443 X |
| 4,274,014 | 6/1981 | Schade, Jr. | 307/451 X |
| 4,275,313 | 6/1981 | Boll et al. | 307/448 |
| 4,394,588 | 7/1983 | Gaudenzi | 307/443 |
| 4,398,106 | 8/1983 | Davidson et al. | 307/200 A X |
| 4,454,571 | 6/1984 | Miyashita | 307/200 B X |
| 4,516,123 | 5/1985 | Shoji | 307/200 B X |
| 4,567,378 | 1/1986 | Raver | 307/443 X |
| 4,570,088 | 2/1986 | Nozaki et al. | 307/481 |
| 4,584,491 | 4/1986 | Ulmer | 307/443 X |
| 4,587,445 | 5/1986 | Kanuma | 307/200 A X |
| 4,609,834 | 9/1986 | Gal | 307/443 |
| 4,628,218 | 12/1986 | Nakaizumi | 307/443 X |
| 4,656,370 | 4/1987 | Kanuma | 307/200 A X |

OTHER PUBLICATIONS

Moshen et al., "The Design and Performance of CMOS 256K Bit DRAM Devices," IEEE Journal of Solid-State Circuits, vol. SC-19, No. 5, pp. 610–618, Oct. 1984.

Primary Examiner—Stanley D. Miller
Assistant Examiner—D. R. Hudspeth
Attorney, Agent, or Firm—Finnegan, Henderson, Farabow, Garrett and Dunner

[57] ABSTRACT

In the buffer circuit for an integrated circuit according to this invention a load MOS transistor and a drive MOS transistor are connected in series between a power source potential node and a ground potential node of the integrated circuit. A constant current circuit means connected in series with a circuit including the load MOS transistor and the drive MOS transistor.

3 Claims, 4 Drawing Sheets (a)

(b)

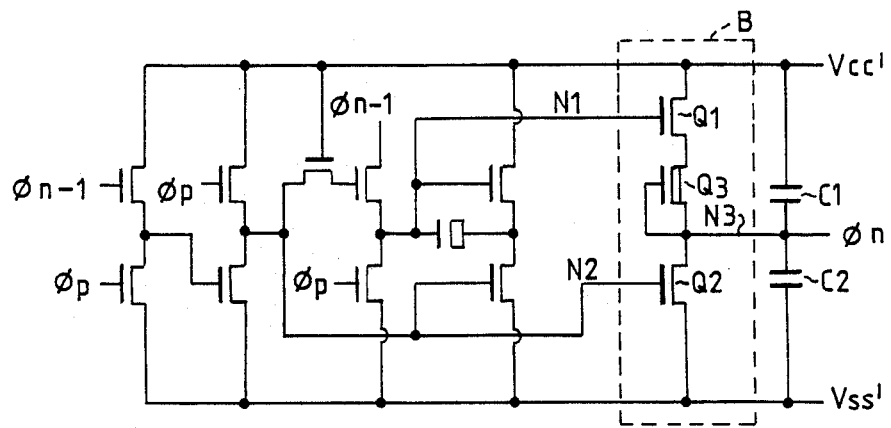
FIG. 7.
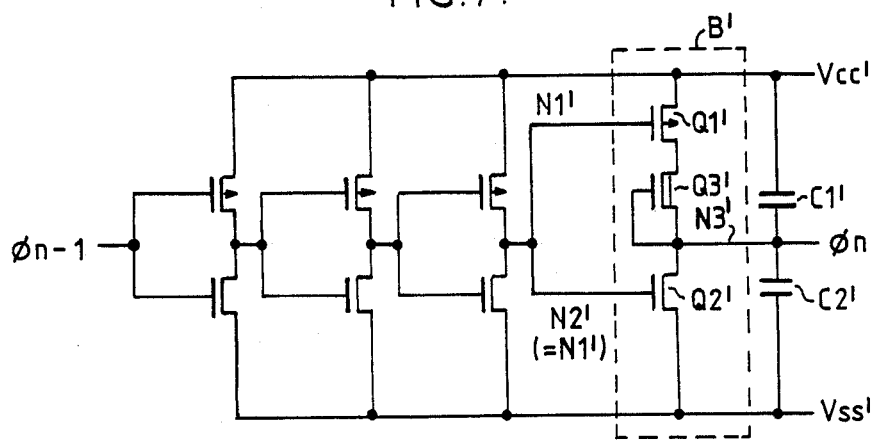
FIG. 8.
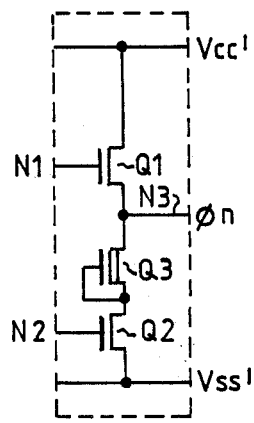 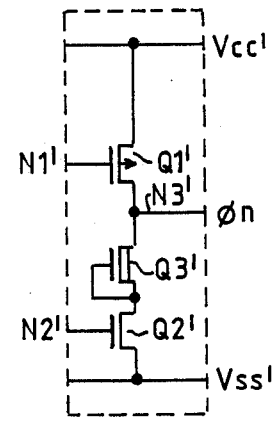 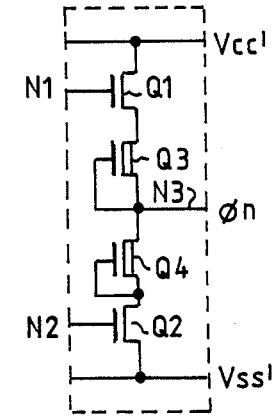
FIG. 9.  FIG. 10.  FIG. 11.

BUFFER CIRCUIT FOR MINIMIZING NOISE IN AN INTEGRATED CIRCUIT

BACKGROUND OF THE INVENTION

1. Field of the Invention

This invention relates to a buffer circuit for a semiconductor integrated circuit. In particular it relates to an improved buffer circuit wherein entry of noise into the in-chip power source is prevented when the output signal is changed.

2. Description of the Related Art

In semiconductor memories, a series of control signals are generated internally for selecting specific memory cells on receipt of an external signal. In such cases, an initial signal is generated first in response to a change of the external signal. In general, a series of signals are sequentially generated with a certain delay between successive signals. FIG. 1 shows a conventional example of a clock pulse generator. It generates signals of this type using NMOS (N channel insulated gate) transistors. FIG. 2 shows a conventional example using CMOS (complementary insulated gate) transistors. In FIG. 1, $\phi$n-1 is the input signal. $\phi$p is the precharge signal. $\phi$n is the output signal. Vcc' and Vss' are the power source potential and ground potential within the integrated circuit chip. BUF is a buffer constituting the final output stage. It consists of two N-channel enhancement type transistors Q1 and Q2 for load and drive. N1 and N2 are the input nodes of this buffer BUF. N3 is the output node of this buffer BUF. C1 is the load capacitance present between this output node N3 and the in-chip power source node. C2 is the load capacitance present between this output node N3 and the in-chip ground node. In FIG. 2, $\phi$n-1 is the input signal, $\phi$n is the output signal, Vcc' and Vss' are the source potential and ground potential within the chip, BUF' is a buffer constituting the final output stage. Buffer BUF' includes a P channel enhancement type transistor Q1' for load and an N channel enhancement type transistor Q2' for drive. N1' and N2' are the input nodes of this buffer BUF'. N3' is the output node of this buffer BUF'. C1' is the load capacitance that exists between this output node N3' and the in-chip power source node. C2' is the load capacitance that exists between this output node N3' and the in-chip ground node.

The construction and operation of the buffers of FIG. 1 and FIG. 2 is well known, and so it will not be described in detail. The signal waveforms of the main nodes produced by changes in the logic level of the respective input signals $\phi$n-1 are shown in FIG. 3 and FIG. 4. In the case of an NMOS circuit, when precharge signal $\phi$p becomes potential Vss' and input signal $\phi$n-1 rises to potential Vcc', after a certain delay, output signal $\phi$n rises to potential Vcc'. When input signal $\phi$n-1 falls to potential Vss' and precharge signal $\phi$p rises to potential Vcc', output signal $\phi$n falls to potential Vss'. In the case of a CMOS circuit, rise and fall of output signal $\phi$n occur after a certain delay after the rise or fall of input signal $\phi$n-1. In both these circuits, an output signal $\phi$n having the capacity to charge or discharge large load capacitances C1 and C2 or C1' and C2' is output with a certain time delay in response to changes in input signal $\phi$n-1.

However, in the case of a dynamic random access memory (RAM), to precharge portions where the number of repeated patterns of the bit line or decoder in the precharging cycle is large, the clock generator for generating the precharging signal must charge or discharge a fairly large load capacitance. FIG. 5 shows the circuit of the final output stage buffer of a clock generator used in such cases. In this Figure, in the case of an NMOS type circuit, load transistor Q1 is an N channel transistor, and in the case of a CMOS type circuit it is a P channel transistor. Drive transistor Q2 is an N channel transistor. N1 and N2 are input nodes. N3 is an output node. Vcc and Vss are the power source potential whereby a constant voltage is supplied from outside the chip, and ground potential, respectively. The impedance component 1 includes an inductive component L and resistive component R possessed by the power source line in the chip. The impedance component 2 includes an inductive component L and resistive component R possessed by the ground potential line in the chip. Vcc' and Vss' are the in-chip power source potential and ground potential. The load capacitance C1 exists between output node N3 and the in-chip power source node. The load capacitance C2 is present between output node N3 and the in-chip ground node. The reference symbol i represents the output current of this buffer circuit. $\phi$n is the output signal of this buffer circuit.

Thus, if an impedance component 1 of the in-chip power source line and an impedance component 2 of the in-chip ground line are present, as described above, large noise signals will be introduced into the in-chip Vcc' and Vss' potentials. This will be described in detail below.

In general, if a current i flows in an impedance component having a resistive component R and inductive component L in series, this produces a voltage drop $iR + L\, di/dt$ in the direction in which this current i flows. Consequently, in the impedance of FIG. 5, when the output singal $\phi$n rises, transistor Q1 goes ON and transistor Q2 goes OFF. The charge of load capacitance C1 moves between the electrodes through transistor Q1, which is now ON, and does not flow into impedance component 1. In contrast, the charge of load capacitance C2 is then supplied from outside-chip power source Vcc through this impedance component 1 and transistor Q1, which is now ON. Since transistor Q2 is OFF, this charge flows to the outside-chip ground power source through impedance component 2. Also, when output signal $\phi$n falls, transistor Q1 is OFF and transistor Q2 is ON. The charge of load capacitance C2 moves across the electrodes through transistor Q2 and does not flow into impedance component 2. In contrast, the charge of load capacitance C1 is then discharged to the outside-chip ground power source through transistor Q2, which is now ON, and through impedance component 2. Since transistor Q1 is OFF, a charge flows in from outside-chip power source Vcc through impedance component 1. The changes in this current i and in its time derivative di/dt when the output signal $\phi$n rises and falls in this way are shown in FIG. 6(a). This introduces a noise signal into the in-chip potential Vcc' and ground potential Vss' causing them to change in the way shown in FIG. 6(b). That is, when the output signal $\phi$n does not change, the amplitudes of the in-chip power source voltage and outside-chip power source voltage are the same. However, when the output signal $\phi$n changes, a noise signal is superimposed on the in-chip power source, producing a fluctuation in the voltage amplitude. It should be noted that although for the sake of simplicity in illustration, the impedance component has been modelled as a distribution of a pure resistive component R and inductive component L, in fact, the distribution of these R and L and the distribution of the load capacitances C1 and C2 is complex. This in turn complicates the amplitude change waveform of the in-chip power source voltage.

As explained above, when a change occurs in the in-chip voltage, for the circuits in the chip this is the same as a large fluctuation in the power source. This, therefore, lowers the power source voltage operating margin of the chip as a whole by a very significant amount. In extreme cases, it may lead to spurious operation or failure of operation of the circuitry in the chip. This tendency becomes more severe as the discharging/charging capacity constituting the load of the buffer output signal becomes greater. This occurs with increasing degrees of circuit integration (i.e. for example, with increased memory capacity of an integrated circuit memory), with increase in the resistive component or inductive component of the in-chip interconnections, and also with increasing speed of circuit operation.

SUMMARY OF THE INVENTION

An object of this invention is to provide a buffer circuit for an integrated circuit whereby the amplitude fluctuation of the in-chip power source voltage that results from changes of the output signal can be suppressed, the operating power source margin of the in-chip circuitry can be raised, and instances of spurious operation or failure of operation can be minimized.

In the buffer circuit for an integrated circuit according to this invention a load MOS transistor and a drive MOS transistor are connected in series between a power source potential node and a ground potential node of the integrated circuit. A constant current circuit is inserted and connected between an output node mutually between the two transistors and the power source potential node, and/or a constant current circuit is inserted and connected between the output node and the ground potential node.

As a result, during variation of the output signal the current can be made essentially constant for the major portion of the time, with the result that the time derivative of the output current can be made substantially zero. Fluctuations (noise components) of the in-chip power source potential and in-chip ground potential produced by the inductance present in the in-chip power source line and in-chip ground line can therefore be suppressed.

BRIEF DESCRIPTION OF THE DRAWINGS

FIG. 7 is a circuit diagram showing a clock generator of an integrated circuit according to an embodiment of this invention.

FIG. 8 is a circuit diagram showing a clock generator of an integrated circuit according to a further embodiment of this invention.

FIG. 9 and FIG. 11 are circuit diagrams showing modifications of the buffer in FIG. 7.

FIG. 10 and FIG. 12 are circuit diagrams showing modifications of the buffer in FIG. 8.

DETAILED DESCRIPTION OF THE PREFERRED EMBODIMENTS

Embodiments of the invention are described in detail below with reference to the drawings.

Figure 1:
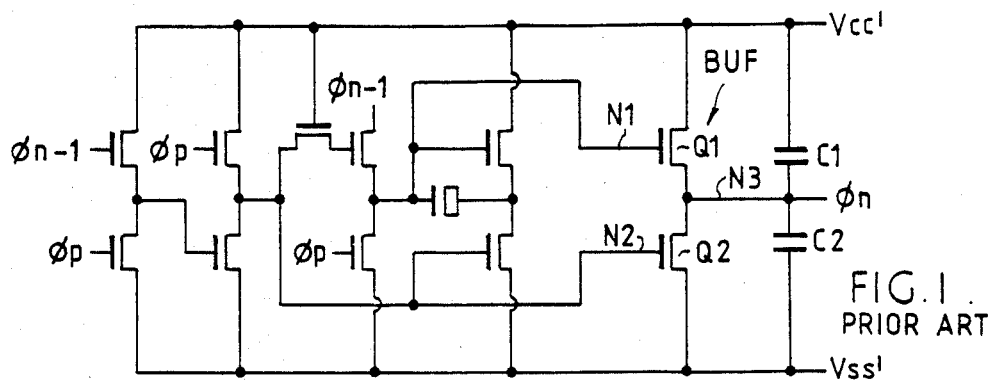
FIG. 1 and FIG. 2 are circuit diagrams showing clock generators in prior art integrated circuits.

FIG. 7 is a clock generator provided in an NMOS integrated circuit. It differs from the conventional NMOS clock generator described above with reference to FIG. 1 in that a constant current element including, for example, an N channel depletion type MOS transistor Q3 whose gate and source are connected to each other, is inserted between load transistor Q1 and output node N3 in the final output stage buffer B. The same symbols as appear in FIG. 1 are used for the other components shown in FIG. 7.

In this buffer B, the current characteristic during rise of the output signal $\phi n$ while transistor Q1 is ON is given the form of a constant current characteristic by constant-current transistor Q3. Although this results in a somewhat slower rate of signal rise, it also reduces the level of the undesirable inductance L-dependent voltage L di/dt (noise component) that is produced by the inductance L contained in the impedance component of the in-chip power source line and in-chip ground line. It should be noted tha since no constant-current element is present in the current path during the fall of output signal $\phi n$, a constant-current characteristic is not obtained during this stage, and a noise signal is produced, as conventionally.

A buffer B, as described above, is suitable for use in cases where noise signals during rise of the output signal $\phi n$ create a problem, and there is a sufficient time margin during the signal rise, but insufficient margin during signal fall. This buffer B also may be used when noise is not a problem during signal fall.

Figure 2:
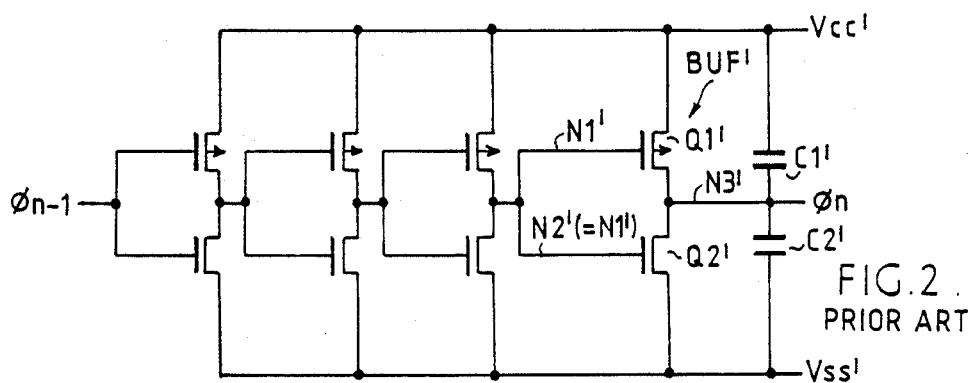
Figure 3:
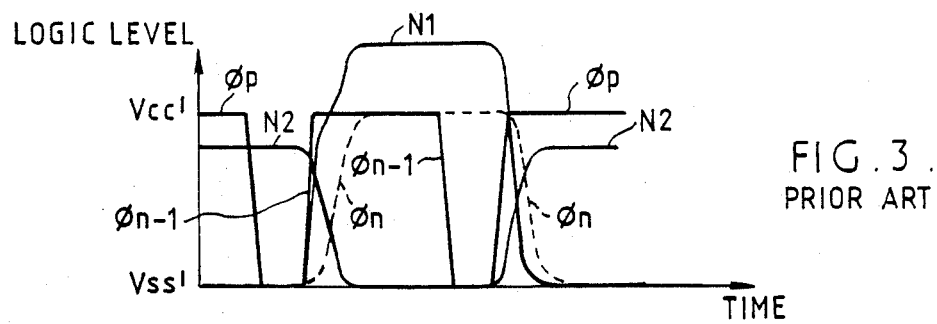
FIG. 3 and FIG. 4 are operational waveform diagrams of the circuits of FIG. 1 and FIG. 2, respectively.
Figure 4:
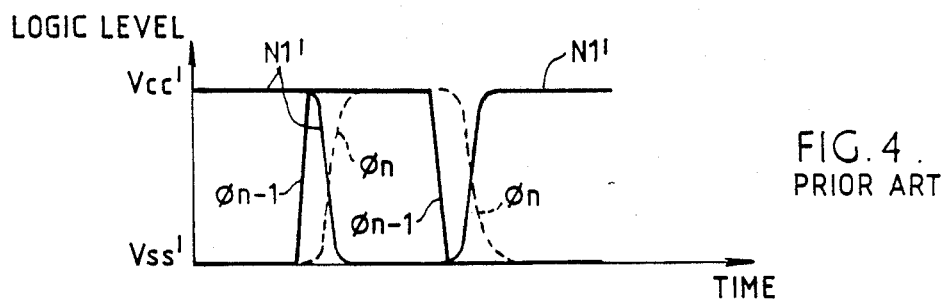

FIG. 8 shows a clock generator provided in a CMOS type integrated circuit. It differs from the conventional clock generator described with reference to FIG. 2 in that a constant-current element such as an N channel depletion type MOS transistor Q3', whose gate and source are connected to each other, is inserted between load transistor Q1' and output node N3' in final-stage buffer B'. The same symbols as appear in FIG. 2 are used for the other components shown in FIG. 8.

In this buffer B', a similar effect is obtained by practically the same operation as in the case of buffer B of the foregoing embodiment.

Figure 12:
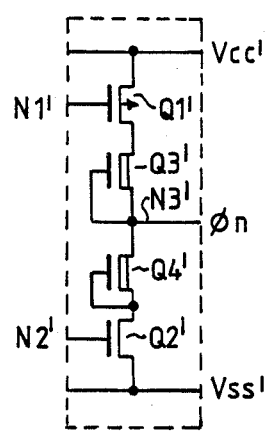

As shown in FIG. 9 and FIG. 10 corresponding respectively to buffers B and B' in the above described embodiments, a modification is effected so as to insert a constant-current N channel depletion type MOS transistor Q3 between output node N3 or N3' and drive transistor Q2 or Q2'. This provides a constant-current characteristic during signal fall. In the buffers shown in FIG. 11 and FIG. 12, constant-current N channel depletion type transistors Q3 and Q4 or Q3' and Q4', whose gate and source are connected to each other, are inserted between respective output nodes N3 or N3', and load transistors Q1 or Q1' and between output nodes N3 or N3' and drive transistors Q2 or Q2'. Thus a constant-current characteristic can be obtained both during signal rise and signal fall. Such a buffer can be applied successfully to the final output stage of a precharge signal generator used in the precharging cycle in a clock generator where the change of output signal does not have to be very steep, as, for example, in a dynamic RAM.

Figure 5:
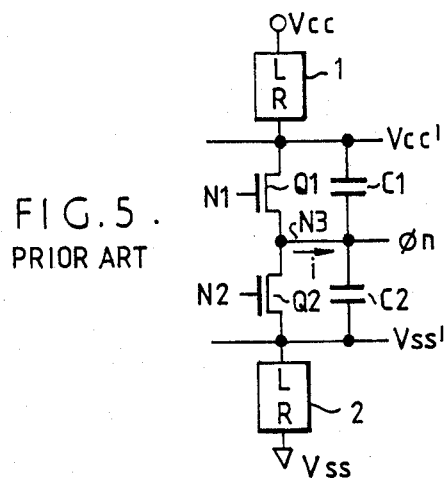
FIG. 5 is a circuit diagram showing a circuit containing an impedance component produced by the chip interconnection with the buffer used in the clock generator of a conventional dynamic RAM.
Figure 6:
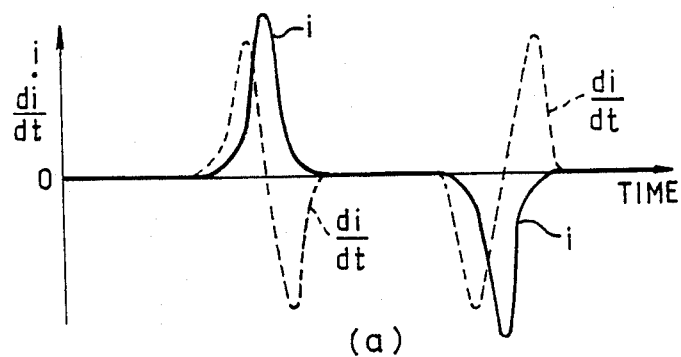
FIGS. 6(a) and (b) are waveform diagrams showing the change in output current and its differential and the change in in-chip power source voltage that occur in operation of the circuit shown in FIG. 5.
Figure 6:
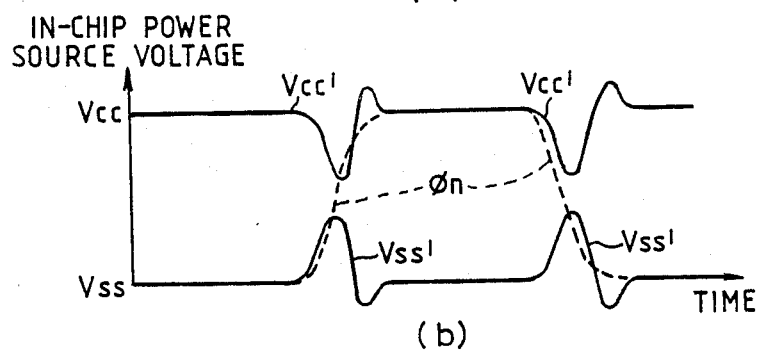
Figure 13:
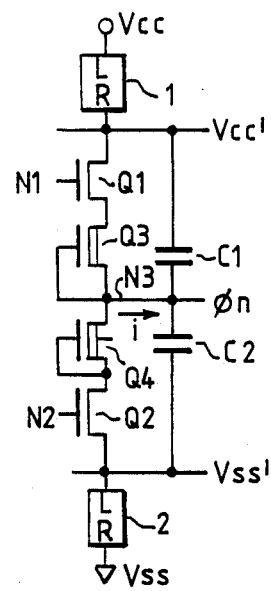
FIG. 13 is a circuit diagram showing a circuit containing an impedance component produced by the in-chip interconnection with the buffer of FIG. 11.
Figure 14:
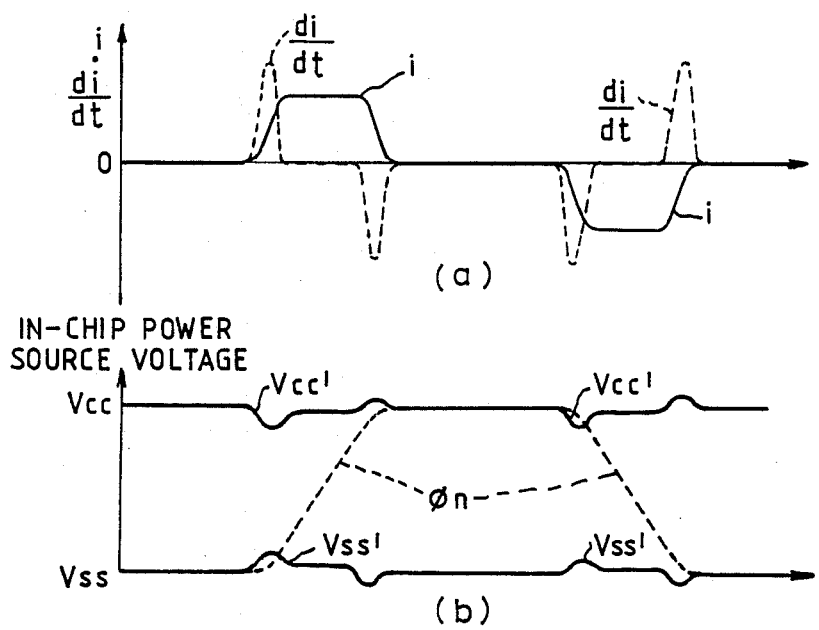
FIGS. 14 (a) and (b) are waveform diagrams showing the change in output current and its differential and the change in the in-chip power source voltage that occur during operation of the circuit shown in FIG. 13.

A description of the mode of operation of the buffer of FIG. 11, chosen by way of example only from the above embodiments, will now be given. FIG. 13 shows a circuit containing a buffer as described above, outside-chip power source terminal Vcc, an outside-chip ground power source terminal Vss, impedance component 1 of the in-chip power source line, and impedance component 2 of the in-chip ground line. Items which are the same as in FIG. 11 and FIG. 5 are given the same reference numerals. FIG. 14(a) shows the variation of output current i during rise and fall of output signal φn in this circuit of FIG. 13, and also the time derivative di/dt. FIG. 14(b) shows the change of the in-chip potential and ground potential which these signals produce. It can be seen that the time derivative di/dt of output current i is zero except at the beginning and end of the change in output signal φn, and is smaller than the di/dt shown in FIG. 6(a) of the description of the prior art example. As a result, voltage L di/dt produced by inductive component L of the impedance components 1 and 2 is reduced, and the peak value of output current i itself also is reduced. Consequently, the voltage Ri produced by the resistive component R becomes constant, so that the fluctuation produced by the noise signal in the in-chip source potential Vcc' and ground potential is reduced greatly in comparison with the prior art example. Furthermore, since in the above buffer circuit there is a constant-current characteristic over most of the period for which output signal φn is changing, the rise and fall of output signal φn occur more smoothly and linearly than in the conventional case.

It should be noted that, although in the foregoing embodiments a constant-current transistor is inserted between the output node and load or drive transistor, the invention is not restricted to this arrangement and it is possible to insert a constant-current transistor between an in-chip power source node and the load transistor or between an in-chip ground potential node and the drive transistor. Furthermore, the invention is not restricted to N channel depletion type transistors. P channel depletion type transistors, other elements that can be made to have a constant-current characteristic, or a constant-current circuit consisting of a combination of a plurality of elements could be used.

As described above, in a buffer in an integrated circuit according to this invention, a constant current circuit is inserted and connected in series with a load MOS transistor or a drive MOS transistor between at least one of the following: an output node and an in-chip power source node, or an output node and an in-chip ground node. Fluctuation in amplitude of the in-chip current and voltage when the output signal varies can thus be suppressed, making it possible to raise the operating power source margin of the in-chip circuitry, minimize spurious operation or failure of operation, and improve reliability of operation of the integrated circuit.

Various modifications and variations could be made to the invention without departing from the scope or spirit of the invention.

What is claimed is:

1. A buffer circuit for an integrated circuit device having an in-chip power source potential and an in-chip ground potential, the buffer circuit comprising:
   a power source node electrically connected to the in-chip power source potential;
   a ground node electrically connected to the in-chip ground potential;
   first and second input nodes for receiving input signals from the integrated device;
   an output node for outputting the output current from the buffer circuit;
   load transistor means connected to the first input node for controlling the output current to the output node;
   drive transistor means connected to the second input node for controlling the output current to the output node;
   a first buffering transistor connected in series with said load transistor means; and
   a second buffering transistor connected in series with said drive transistor means and said first buffering transistor, said first and second buffering transistors stabilizing the in-chip power source and ground potential of the device by suppressing fluctuations in the amplitude of the output current and defining said output node therebetween.

2. The circuit of claim 1 wherein said first and second buffering transistors are N channel depletion type MOS transistors having their respective gates and sources connected together.

3. The circuit of claim 1 wherein said first and second buffering transistors are P channel depletion type MS transistors having their respective gates and sources connected together.

* * * * *